United States Patent [19]
Fukase et al.

[11] Patent Number: 5,643,433
[45] Date of Patent: Jul. 1, 1997

[54] LEAD FRAME AND METHOD FOR MANUFACTURING SAME

[75] Inventors: Katsuya Fukase; Takahiro Iijima; Masao Nakazawa; Shinichi Wakabayashi, all of Nagano, Japan

[73] Assignee: Shinko Electric Industries Co., Ltd., Nagano, Japan

[21] Appl. No.: 172,286

[22] Filed: Dec. 23, 1993

[30] Foreign Application Priority Data

Dec. 23, 1992 [JP] Japan ................................. 4-357014

[51] Int. Cl.⁶ ................................................. C25D 1/00
[52] U.S. Cl. ........................ 205/78; 205/67; 205/122
[58] Field of Search ............................. 205/122, 123, 205/78, 67; 437/220

[56] References Cited

U.S. PATENT DOCUMENTS

| | | | |
|---|---|---|---|
| 3,971,428 | 7/1976 | Hall | 164/46 |
| 4,125,441 | 11/1978 | Dugan | 204/12 |
| 4,480,150 | 10/1984 | Jones | 174/52.4 |
| 4,584,039 | 4/1986 | Shea | 156/150 |
| 5,083,186 | 1/1992 | Okada | 257/669 |
| 5,221,428 | 6/1993 | Ohsawa | 156/652 |

FOREIGN PATENT DOCUMENTS

| | | |
|---|---|---|
| 48-039867 | 11/1973 | Japan . |
| 61-208859 | 9/1986 | Japan . |
| 4-280661 | 10/1992 | Japan . |
| 5-183083 | 7/1993 | Japan . |

OTHER PUBLICATIONS

Derwent abstract of JP 62-2643 (Jan. 1987).
Abstract of JP 3-14263 (Jan. 1991).
Abstract of JP 57-171681 (Oct., 1982).
Abstract of JP 4-333244 (Nov., 1992).

*Primary Examiner*—John Niebling
*Assistant Examiner*—Brendan Mee
*Attorney, Agent, or Firm*—Staas & Halsey

[57] ABSTRACT

A method for manufacturing a lead frame employing a resist pattern formed on a matrix and having a cavity therein, in which an electro-deposition pattern is formed. A connecting cavity portion interconnects tip ends of inner lead cavity portions such that a connecting portion interconnects the tip ends of inner leads of the electro-deposition pattern formed in the cavity. The connecting piece is maintained while the electro-deposition pattern is separated from the matrix and the resist.

7 Claims, 9 Drawing Sheets

1

LEAD FRAME AND METHOD FOR MANUFACTURING SAME

BACKGROUND OF THE INVENTION

1. Field of the Invention

The present invention relates to a lead frame adapted to be used for a semiconductor device and a method for manufacturing the same.

2. Description of the Related Art

In general, lead frames for use in semiconductor devices are manufactured by punching or etching metallic materials.

However, in the case of punching or etching, the minimum processing width is approximately the same as the material thickness so that the processing range is limited, and there is a limit to forming a fine pattern from a material of a predetermined thickness.

On the other hand, as well known, there is provided a method for manufacturing lead frames by means of electro-forming (disclosed in Japanese Examined Patent Publication (Kokoku) No. 48-39867).

This known electro-forming process is shown in FIGS. 7(a), (b), (c), (d) and (e), and will be described below: A resist 11 is coated or adhered on a matrix 10 made of conductive material such as stainless steel, as shown in FIG. 7(a); pattern printing is conducted, as shown in FIG. 7(b); developing is conducted so as to form a resist pattern 12, as shown in FIG. 7(c); when this resist pattern is used as a mask, an electro-deposition pattern 13 is formed on the matrix 10 by means of plating, as shown in FIG. 7(d); the resist pattern 12 is removed; and further the electro-deposition pattern 13 is separated from the matrix 10, as shown in FIG. 7(e).

Next, the electro-deposition pattern 13 is subjected to necessary plating. In this way, a lead frame is manufactured.

In some cases, after the resist pattern 12 has been removed from the matrix 10, a surface of the electro-deposition pattern 13 is ground so that the thickness of the electro-deposition pattern 13 can be made uniform.

According to this electro-forming process, a lead frame having a very fine pattern, the section of which is rectangular, can be accurately manufactured.

In the above manufacturing process of lead frames, the following problems may be encountered: When the electro-deposition pattern 13 is separated from the matrix 10 in the electro-forming process, the electro-deposition pattern 13 may be deformed. Also, the electro-deposition pattern 13 may be deformed in the processes conducted after electro-forming, for example, in the process of plating. Further, in the case where the electro-deposition pattern 13 is ground, the electro-deposition pattern 13 tends to be deformed. Such a deformation of the electro-deposition pattern 13 may become substantial when the pattern is fine.

Also, if the inner lead pattern becomes finer, the resist pattern 12 for the mask must become finer and, therefore, the electro-deposition pattern 13 must be developed in narrow recesses of the resist pattern 12. When electro-forming is conducted, hydrogen is generated due to a negative pole reaction. If the resist pattern 12 is narrow as mentioned above, the hydrogen particles in small bubbles will be attached to the inner walls of the resist pattern 12 because the plating liquid does not flow smoothly. Therefore, a good plated film is not formed, since small pits or holes are formed in the electro-deposition pattern 13.

SUMMARY OF THE INVENTION

The present invention has been developed to solve the above problems. It is an object of the present invention to provide a method for manufacturing a lead frame by which an electro-deposition pattern is not deformed in the processes conducted after an electro-forming process, for example, in the process of plating.

In order to solve the above problems, the present invention is provided with the following construction.

The present invention provides a method for manufacturing a lead frame in which a predetermined pattern is formed on a matrix by a resist, an electro-deposition portion is provided in a cavity formed in the resist pattern, and the electro-deposition pattern is separated from the matrix, said method comprising the steps of forming the resist pattern on the matrix so that a cavity portion for connecting tip ends of a plurality of cavities for forming inner leads is included in the resist pattern; providing an electro-deposition portion into the cavity portion as well as said plurality of cavities so that the electro-deposition pattern can be formed into a configuration in which tip ends of the inner leads are connected by a connecting piece; and separating the electro-deposition pattern from the matrix while the tip ends of the inner leads are connected by the connecting piece.

It is preferable to provide a method for manufacturing a lead frame which further comprises the steps of: conducting required processes including a plating process after the separation of the electro-deposition pattern while the tip ends of the inner leads are connected by the connecting piece; and then removing and separating the connecting piece from said electro-deposition pattern.

According to the above, the electro-deposition pattern is formed so that the tip ends of the inner leads can be connected with the connecting piece. Therefore, deformation of the inner lead can be prevented when the electro-deposition pattern is separated from the matrix and also when the electro-deposition pattern is subjected to the processes such as plating after that. Even when the electro-deposition pattern is ground in the electro-forming process, deformation can be prevented to the utmost since the fore ends of the inner lead are connected by the connecting piece.

Also, according to the present invention, since there is a recess for the connecting piece for connecting a plurality of inner leads, the plating liquid flows smoothly and therefore hydrogen generated due to the negative pole reaction liquid is not attached to the inner walls of the resist pattern. Thus, generation of small pits or holes in the electro-deposition pattern is prevented.

In another aspect of this invention, there is provided a method for manufacturing a lead frame in which a predetermined pattern is formed on a matrix by a resist, an electro-deposition portion is provided in a cavity formed in said resist pattern, and said electro-deposition pattern is separated from said matrix, said method comprising the steps of forming a necessary plated coat on said electro-deposition pattern after said electro-deposition pattern has been formed on said matrix; and then separating said electro-deposition pattern from said matrix.

Since the electro-deposition pattern is subjected to plating before the electro-deposition pattern is separated from the matrix, the deformation of the electro-deposition pattern can be prevented in a plating process.

In still another aspect of this invention, there is provided a method for manufacturing a lead frame in which a predetermined pattern is formed on a matrix by a resist, an electro-deposition portion is provided in a cavity formed in said resist pattern, and said electro-deposition pattern is separated from said matrix, said method comprising the steps of removing said resist after said electro-deposition pattern has been formed; fixing a portion of said electro-deposition pattern corresponding to inner leads in which said electro-deposition pattern is dense, with a fixing member; and separating said electro-deposition pattern from said matrix.

Also, there is provided a method for manufacturing a lead frame in which a predetermined pattern is formed on a matrix by a resist, an electro-deposition portion is provided in a cavity formed in said resist pattern, and said electrode-deposition pattern is separated from said matrix, said method comprising the steps of removing said resist after said electro-deposition pattern has been formed; providing a dumb bar in base portions of outer leads of said electro-deposition pattern for preventing a leakage of resin in the process of molding and also for fixing said outer leads; and separating said electro-deposition pattern from said matrix while said dumb bar is fixing said outer leads.

Under the condition that the inner leads are fixed by the fixing member, and the outer leads are fixed by the dumb bar, the electro-deposition pattern is separated from the matrix. Therefore, the deformation of the leads can be prevented when the electro-deposition pattern is separated from the matrix.

Also, there is provided a lead frame comprising a predetermined pattern which is formed by providing a plated coat on a matrix by means of electro-forming, characterized in that a stage portion of said lead frame on which a semiconductor element is to be mounted is formed thicker than inner leads by a multi-layer plated coat. Since the stage portion is formed thicker than the inner leads from a multi-layer plating coat, a lead frame having high radiating properties can be obtained. The stage portion may be formed from a multi-layer composed of plated coats made of different metals. If the stage portion is a multi-layer plating coat made of different metals, a lead frame having sufficient radiating properties and mechanical strength can be obtained.

There is also provided a lead frame, wherein tip ends of predetermined inner leads surround a stage portion, and said stage portion is connected by a thin connecting portion of a plated coat protruded from the tip ends of the inner leads and an outer periphery of the stage portion.

If the tip ends of the inner leads for ground connection and the stage portion are connected by a thin connecting portion, and also if a stage support bar and the stage portion are connected by the thin connecting portion, the connection can be easily conducted, and an excessive force is not given in the case of depressing in which the stage portion is depressed with respect to the inner lead surface. Therefore, the deformation of the inner leads can be prevented.

A plurality of dimples may be provided on a surface opposite to a surface of said stage portion on which a semiconductor element is mounted, and said dimples are formed in such a manner that the diameter thereof is extended as it advances to the inside from the opposite surface. If the dimples are formed in the stage portion, adhesion can be improved with respect to the resin for sealing.

There is also provided a lead frame formed by electroforming, characterized in that an outer lead of said lead frame is formed into a multi-layer.

The multi-layer portion of said lead frame may be composed of a metallic layer and a reinforcing layer formed on one side or both sides of said metallic layer.

The metallic layer may be made of copper or copper alloy and said reinforcing layer may be made of iron, nickel or alloy of these metals.

Also, there is provided a method for manufacturing a lead frame by electro-forming, characterized in that a metallic layer is formed on a matrix in accordance with a pattern of said lead frame and a reinforcing layer is formed at least on the pattern of an outer lead portion on said metallic layer.

Also, there is provided a method for manufacturing a lead frame by electro-forming, characterized in that a reinforcing layer is formed on a matrix in accordance with at least a pattern of an outer lead portion in a pattern of the lead frame; a metallic layer is formed on said reinforcing layer in accordance with the pattern of said lead frame; and a reinforcing layer is formed at least on a pattern of the outer lead portion of said metallic layer.

If the main body portion of a lead frame is formed by electro-forming, it is possible to manufacture the lead frame easily when the inner leads and the like are formed into a very fine pattern. Also, if the main body portion of the lead frame is made of copper or copper alloy, a lead frame product excellent in radiating properties and electric characteristics can be provided. Since the reinforcing layer is formed in the outer lead portion, a product having mechanical strength necessary to allow bending of the lead can be obtained, and a highly reliable product can be provided.

DESCRIPTION OF THE PREFERRED EMBODIMENTS

Referring to the accompanying drawings, preferred embodiments of the present invention will be explained in detail hereafter.

FIGS. 1(a) to 1(h) show the first embodiment of the invention.

The electro-deposition processes shown in FIGS. 1(a), 1(b), 1(c) and 1(d) are the same as the conventional electro-deposition processes shown in FIG. 7(a) to 7(d), respectively. Therefore, the explanation of these processes of the electro-deposition will be omitted here.

In order to make the thickness of the deposition pattern 13 uniform, the electro-deposition pattern 13 is appropriately ground.

Figure 1:
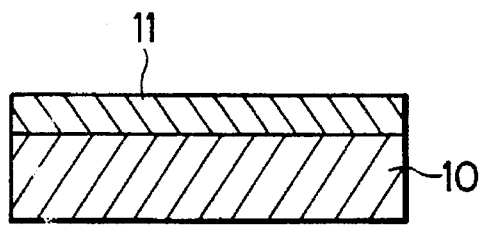
FIGS. 1(a) to 1(h) show a process of a first embodiment of the present invention.
Figure 1:
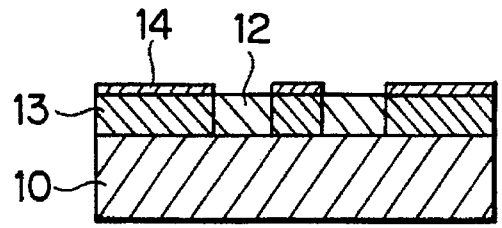
Figure 1:
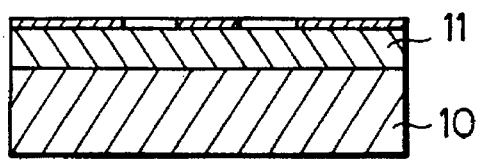
Figure 1:
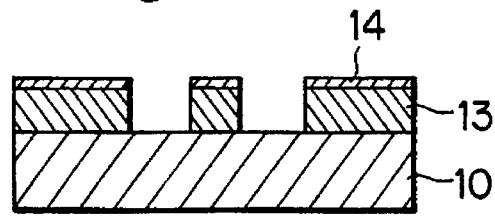
Figure 1:
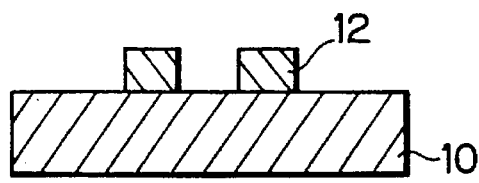
Figure 1:
Figure 1:
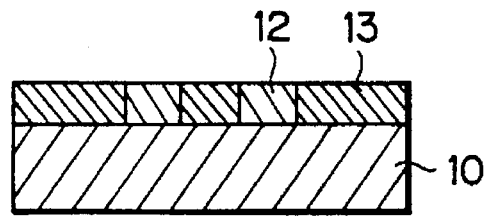
Figure 1:
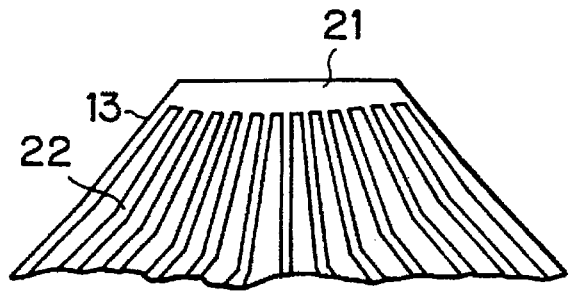

As shown in FIG. 1(h), the electro-deposition pattern 13 is formed in such a manner that the tip ends of inner leads 22 are connected by a connecting piece 21. In order to form this connecting piece 21, a cavity portion is formed for connecting the tip ends of a plurality of cavities for inner lead formation, and the electro-deposition pattern 13 is also provided in this cavity portion for the connecting piece 21, so that the connecting piece 21 is formed.

Next, in this embodiment, while the resist pattern 12 is left (i.e., remains in place), the electro-deposition pattern 13 is subjected to necessary plating such as silver plating so as to form a plating layer 14, as shown in FIG. 1(e).

Next, the resist pattern 12 is removed, as shown in FIG. 1(f). Finally, the electro-deposition pattern 13 is removed from the matrix 10. In this way, the lead frame is completed, as shown in FIG. 1(g).

After that, in order to make a stage surface (not shown) lower compared to the inner lead surface, a stage support bar (not shown) is subjected to depressing formation by which a step is provided on the stage support bar. Then, after the inner leads 22 are fastened by a tape piece (not shown) to prevent movement, the connecting piece 21 is removed. The processes of depressing, fixing by a tape piece, and removing the connecting piece 21 may be conducted in an order different from that described above. That is, the order may be changed in accordance with the configuration of the lead frame. The above-mentioned stage is used for mounting thereon a semiconductor chip.

In this embodiment, the electro-deposition pattern 13 is formed under the condition that the tip ends of the inner leads 22 are connected with the connecting piece 21. Accordingly, deformation of the inner leads 22 can be prevented, when the surface of the electro-deposition pattern 13 is ground, when the electro-deposition pattern 13 is separated from the matrix 10, when the electro-deposition pattern 13 is handled, and in any process after that.

In this embodiment, plating is conducted while the resist pattern 12 is left (i.e., remains in place), so that the deformation of the electro-deposition pattern 13 can be prevented, and a plating layer is not formed on the side of the electro-deposition pattern (i.e., lead) 13 of the obtained lead frame, so that a short circuit caused between the leads by the migration and peeling of a plating layer can be prevented.

In this connection, the electro-deposition pattern 13 may be ground to make the thickness of the electro-deposition pattern 13 uniform after the removal of the resist pattern 12, and then the electro-deposition pattern 13 may be subjected to plating. Also, in this case, the deformation of the electro-deposition pattern 13 can be prevented since the electro-deposition pattern 13 is subjected to plating under the condition that it is supported by the matrix 10.

Further, plating may be conducted after the electro-deposition pattern 13 is peeled off from the matrix 10. In this case, since the inner leads 22 are connected with the connecting piece 21, the deformation of the inner leads 22 can also be prevented. Due to the foregoing, after electro-forming has been completed, the electro-deposition pattern 13 is subjected to plating. Therefore, a conventional plating process of lead frames can be carried out. Therefore, advantageously, it is not necessary to change the conventional apparatus therefor. Further, after the electro-deposition pattern 13 has been peeled off, plating is conducted. Accordingly, it is advantageous that a flat surface which has been closely contacted with the matrix 10 can be used as a wire bonding surface.

In this connection, in the case of a lead frame in which plating is not required at all, of course, the plating process is omitted.

Figure 2:
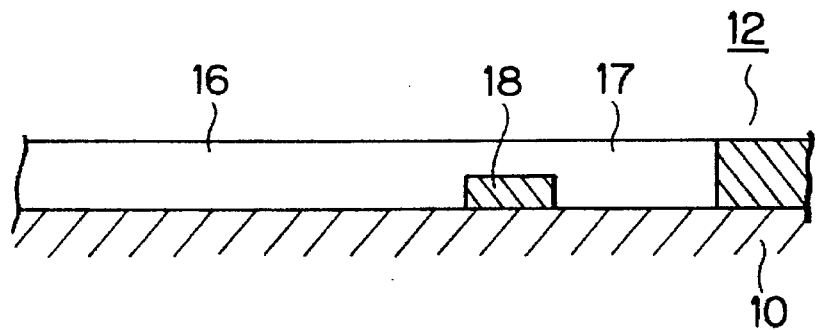
FIG. 2 is a schematic illustration showing another embodiment of a resist pattern.

FIG. 2 shows the second embodiment of this invention.

In this embodiment, the resist pattern 12 is formed by leaving a resist portion 18, the height of which is smaller than that of other resist portions, in a boundary between the tip end of a cavity 16 for the formation of the inner lead 22 and a cavity portion 17 for the formation of the connecting piece 21, and plating is carried out on the resist pattern 12.

Figure 3:
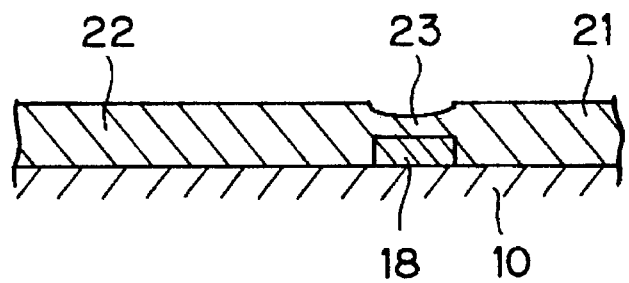
FIG. 3 is a schematic illustration showing an example in which a thin portion is formed in a connecting base portion of the inner lead and the connecting piece.

Due to the foregoing, as illustrated in FIG. 3, electro-deposition portions on the side of the cavity 16 for inner lead formation, and that on the side of the cavity 17 for connecting piece formation can be connected in a bridge form astride the resist portion 18 having a lower thickness. In this way, a thin portion 23 is formed in a connecting base portion with which the connecting piece 21 of the tip ends of the inner leads 22 are connected.

As the thin portion 23 is formed in the above manner, the connecting piece 21 can be easily removed. In this case, the connecting piece 21 is removed after a piece of tape has been stuck on the inner lead 22 to fix the lead frame.

It is preferable that such a resist portion 18, having a lower (i.e. reduced) thickness, of the resist pattern 12 be formed in the following manner.

Figure 4:
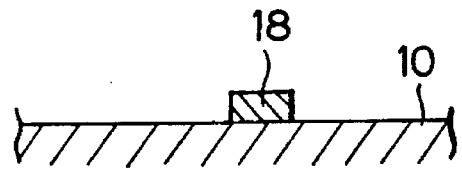
FIGS. 4(a) and 4(b) are schematic illustrations showing an example in which the resist pattern in FIG. 3 is formed.
Figure 4:
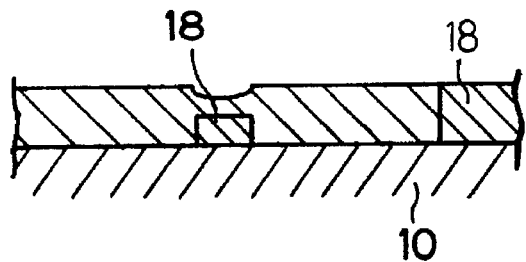

First, as illustrated in FIG. 4(a), the resist portion 18 having a lower thickness is formed at a predetermined position. Then, as illustrated in FIG. 4(b), a resist is further coated on the resist portion 18 which has already been formed, and then the pattern is plated and developed.

Figure 5:
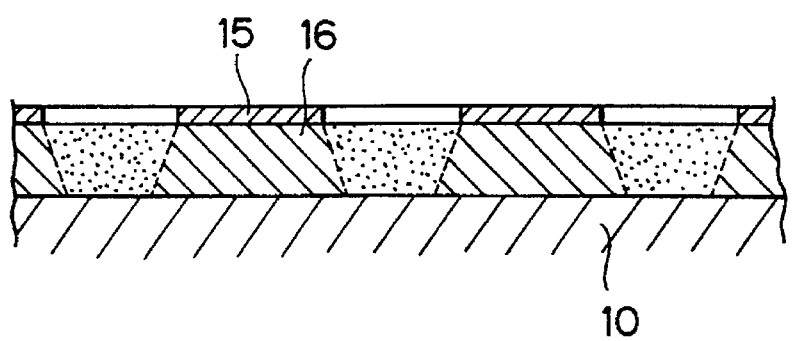
FIG. 5 is a schematic illustration showing an example of a section of a cavity portion for the formation of the inner lead.

FIG. 5 shows still another embodiment of this invention.

In the resist pattern 12 of this embodiment, a section of the cavity 16 for the formation of the inner leads is formed into a trapezoid in which the matrix 10 side is wider as illustrated in the drawing.

Due to the foregoing, a section of the inner lead 22 growing in the cavity 16 for the formation of the inner lead is formed into a trapezoid. When a side closely contacting with the matrix 10 side is used as a bonding surface as described above, a wide bonding area can be ensured.

In order to form the section of the cavity 16 for the inner lead formation into a trapezoid, the following method is recommended.

In the case of exposure of a negative type resist, it is exposed to a beam of light, the intensity of which is relatively low. Then, the inside is exposed to light less than the surface as illustrated in the drawing. Due to the foregoing, the grade of sensitization is inclined, so that a tapered surface can be formed in the development as described above. Reference numeral 15 denotes a mask.

In order to form a section of the cavity 16 for the formation of the inner lead into a reverse trapezoid, sensitization processing may be conducted opposite to the aforementioned manner. In this case, when a grinding surface side of the electro-deposition pattern 13 is used as a bonding surface, a wide bonding area can be ensured.

In this connection, a connecting base portion with which the connecting piece 21 of the inner lead 22 is connected, may be formed narrow so that the connecting piece 21 can be easily removed.

Figure 6:
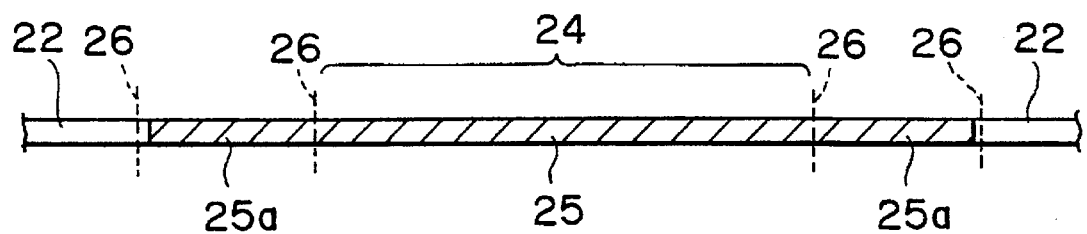
FIG. 6 is a sectional view showing another embodiment of the connecting piece.
Figure 7:
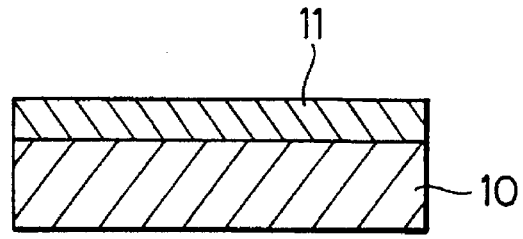
FIGS. 7(a) to 7(e) show a process of a conventional method for manufacturing a lead frame.
Figure 7:
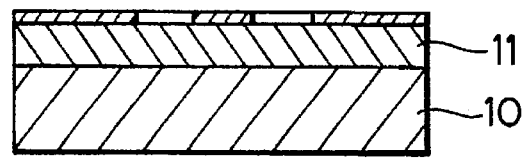
Figure 7:
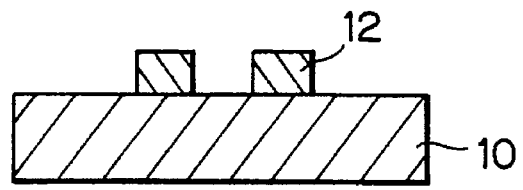
Figure 7:
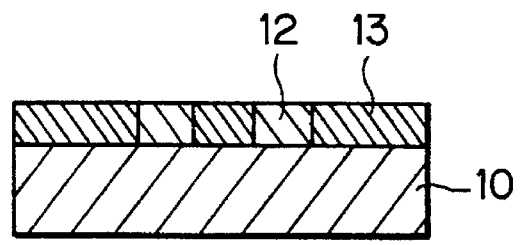
Figure 7:

FIG. 6 shows still another embodiment of this invention.

This embodiment shows an example of manufacture of the lead frame having a stage on which a semiconductor chip is to be mounted. In this embodiment, electro-deposition is conducted in such a manner that a tip end of the inner lead 22 of the electro-deposition pattern 13 is connected with a wide connecting piece 25 including a stage 24.

As described above, under the condition that the tip ends of the inner lead 22 are connected with the connecting piece 25, the following processes are carried out in the same manner as described above. A process for peeling the electro-deposition pattern 13 from the matrix; a plating process; a process for fixing the inner lead 22 with a piece of tape; and a process for forming the tip end of the inner lead 22, stage support bar, and the stage 24 by means of punching.

Also, in this embodiment, under the condition that the inner leads 22 are connected with the connecting piece 25, the inner leads 22 are subjected to a peeling process for peeling the inner leads 22 from the matrix 10, and a plating process. Therefore, the deformation of the inner leads 22 can be prevented. The connecting portion 25a is removed in the later stage by cutting along the lines 26.

In the above embodiments, as the connecting piece 21 (or 25) is formed, the thickness of the electro-deposition pattern 13 electrically deposited on the matrix 10 can be also made uniform. That is, the inner lead 22 is narrower compared to the stage. Therefore, when the electro-deposition pattern 13 is formed by means of plating, the electric current density is increased, so that the thickness of a plating layer tends to increase compared to other portions. However, as the connecting piece 21 (or 25) is formed, a portion of the connecting piece 21 (or 25) acts as a dumb bar, and the concentration of electric current density on the tip ends of the inner lead 22 can be avoided. Therefore, the thickness of the electro-deposition pattern 13 can be made uniform. As a result, stress generated in the process of plating can be reduced, and looseness of the inner leads 22 can be prevented.

According to the above-mentioned several embodiments, the electro-deposition pattern is formed so that the tip ends of the inner lead can be connected with the connecting piece. Therefore, the deformation of the inner lead can be prevented in an electro-forming process and after processes such as plating. Particularly, according to the above-mentioned embodiments, a flow of the plating liquid can be improved due to the connecting piece 21, so that the thickness of the tips of the inner leads 22 can be prevented from being diminished.

Figure 8:
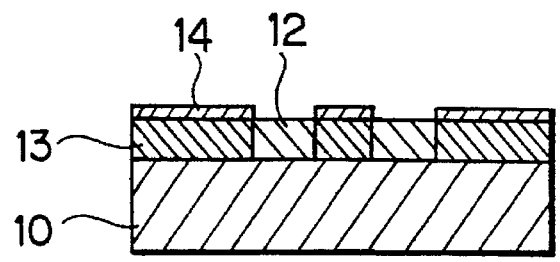
FIGS. 8(a) to 8(d) show still another embodiment of the present invention.
Figure 8:
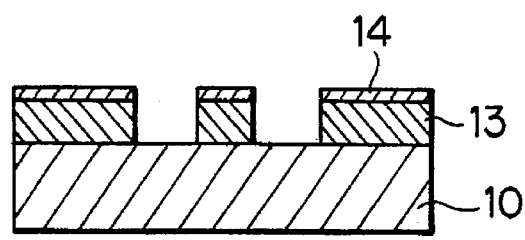
Figure 8:
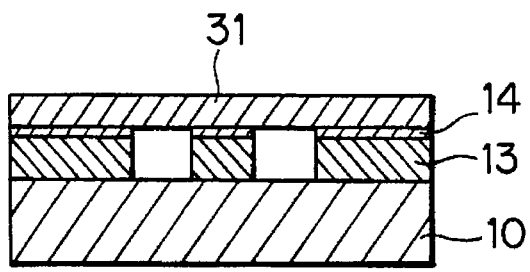
Figure 8:
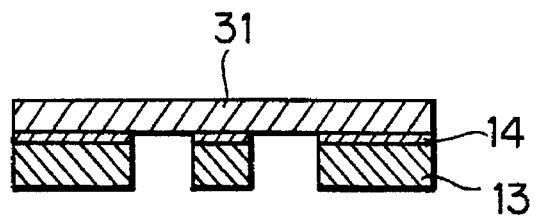

FIGS. 8(a) to 8(g) show another embodiment of this invention. The continuous processes as shown in FIGS. 1(a) to 1(g) can also be applied to this embodiment. That is, while the resist pattern 12 is left, the electro-deposition pattern 13 is subjected to plating, as shown in FIG. 8(a), and then the resist pattern 12 is removed, as shown in FIG. 8(b). Alternatively, after the resist pattern 12 has been removed, the electro-deposition pattern 13 can be subjected to plating.

Next, in this embodiment, the fixing member 31 such as a tape is fixed onto a portion of the electro-deposition pattern 13 where the leads are dense, that is, the fixing member 31 is fixed onto the inner leads, as shown in FIG. 8(c). Next, under the condition that the leads are fixed by the fixing member 31, the electro-deposition pattern 13 is separated from the matrix 10, as shown in FIG. 8(d).

In this embodiment, as the electro-deposition pattern 13 is separated from the matrix 10 under the condition that the portions between the inner leads are fixed by the fixing member 31, the deformation of the inner leads can be prevented when they are separated from the matrix 10 or when they are handled after that.

Various materials can be used for the fixing member 31, such as an adhesive tape, a resin sheet, a photosensitive dry film, or a sheet on which a resist is coated by means of printing and then dried.

Figure 9:
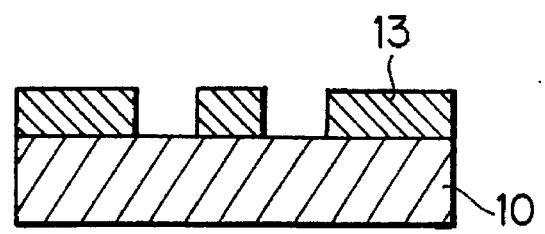
FIGS. 9(a) to 9(c) show still another embodiment of the present invention.
Figure 9:
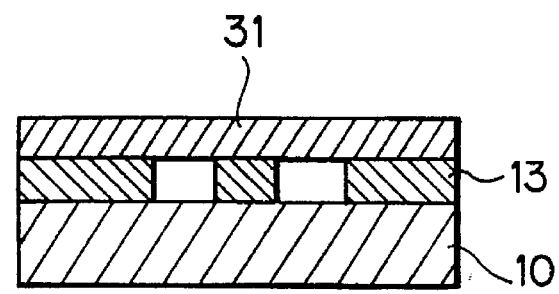
Figure 9:
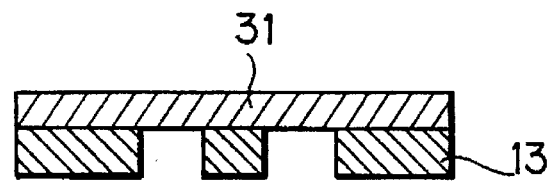

FIGS. 9(a) to 9(c) show a still another embodiment of this invention.

In this embodiment, after the electro-deposition process as shown in FIG. 1(d) has been completed, the resist pattern 12 is removed without conducting a plating process, as shown in FIG. 9(a). Next, the inner lead portion is fixed by the fixing member 31, as shown in FIG. 9(b). The electro-deposition pattern 13 is separated from the matrix 10, as shown in FIG. 9(c). After that, plating is performed if necessary. In this way, the manufacture of the lead frame is completed.

Also, in this embodiment, the deformation of the inner leads can be effectively prevented in the case where the electro-deposition pattern 13 is separated from the matrix 10 and after that.

In the above embodiment, the fixing member 31 is used only for fixing the inner leads. However, like a lead frame of what is called an LOC (lead on chip) or a COL (chip on lead) type, the fixing member 31 may be a tape which fixes the inner leads and mounts a semiconductor element. Accordingly, this embodiment can be advantageously applied to LOC or COL type semiconductor devices.

In this connection, in the embodiments shown in FIGS. 8(a) to 8(d) and FIGS. 9(a) to 9(c), the connecting piece 21 which connects the tip ends of the inner leads is not always necessarily provided.

Figure 10:
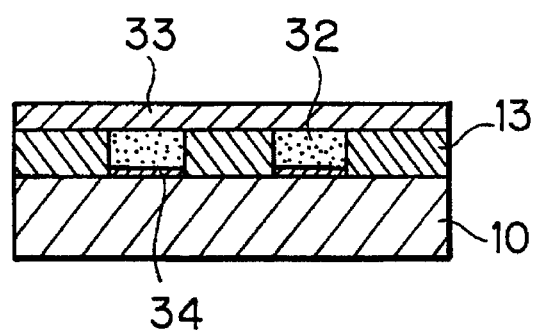
FIG. 10 shows an embodiment of the present invention which includes a dumb bar.

FIG. 10 shows another embodiment of this invention, in this embodiment, a dumb bar 32 is formed in a base portion of the outer leads.

The dumb bar 32 is provided for the purpose of preventing the leakage of resin (not shown) from gaps between the outer leads in the case where the semiconductor chip or element (not shown) is sealed with resin after a semiconductor element has been mounted on the lead frame and subjected to wire-bonding. Therefore, the dumb bar 32 is provided for filling the gaps between the outer leads.

The dumb bar 32 is formed in the same manner as that of the formation of the fixing member 31 in the previous embodiment.

That is, after the process of plating, the dumb bar 32 is formed in the base portion of the outer leads in the same manner as that of the fixing member 31 in the previous embodiment, shown in FIGS. 8(a) to 8(d). Alternatively, in the same manner as that of the embodiment, shown in FIGS. 9(a) to 9(c), the dumb bar 32 is formed and the electro-deposition pattern 13 is separated from the matrix 10. After that, the electro-deposition pattern 13 is subjected to plating if necessary.

When the dumb bar 32 is formed in the base portion of the outer leads as described above, the outer lead portion can be fixed by the dumb bar 32 in the same manner as that of the aforementioned fixing member 31. Accordingly the deformation of the pattern 13 can be prevented when the electro-deposition pattern 13 is separated from the matrix 10, or when the electro-deposition pattern 13 is handled in the plating process after the electro-deposition pattern has been separated from the matrix 10.

The dumb bar 32 may be formed by means of electro-deposition. It becomes difficult, however, to trim the dumb bar when the outer leads are formed into a fine pattern.

When the dumb bar 32 is made of a different insulating member like this embodiment, it is not necessary to conduct trimming. Since the dumb bar 32 is fixed before the separation of the electro-deposition pattern 13, there is no possibility that the electro-deposition pattern is deformed in the formation of the dumb bar.

The dumb bar 32 may be formed in the following manner: As illustrated in FIG. 10, an adhesive tape 33 is pressed against the outer lead base portion so as to be adhered, so that the adhesive is filled in the gaps between the outer leads. Alternatively, a photosensitive resist is filled in the gaps between the leads of the outer lead base portion by means of screen printing, and then the resist is dried and hardened so as to form a dumb bar (not shown).

The dumb bar 32 is formed when the photosensitive resist is filled in the gaps between the leads closed by the matrix 10. Therefore, it becomes easy to fill the gaps with the photosensitive resist. However, it is necessary to use a dumb bar 32, the separability of which is high with respect to the matrix 10. For this reason, as illustrated in FIG. 10, it is preferable to provide a coating 34, the separability of which is high, on a portion of the matrix 10 corresponding to the dumb bar 32.

In the above embodiments, the fixing member 31 and the dumb bar 32 are separately provided. However, it is a matter of course that both the fixing member 31, for fixing the inner lead portion, and the dumb bar 32, for fixing the outer leads, are provided. When both the inner leads and the outer leads are fixed, the deformation can be more effectively prevented in the separation from the matrix 10 and in the process of plating.

In the above embodiments, in the case where the electro-deposition pattern 13 is subjected to plating after it has been separated from the matrix 10, it is preferable that a flat surface of the electro-deposition pattern 13 on the matrix 10 side is formed into a bonding surface.

Figure 11:
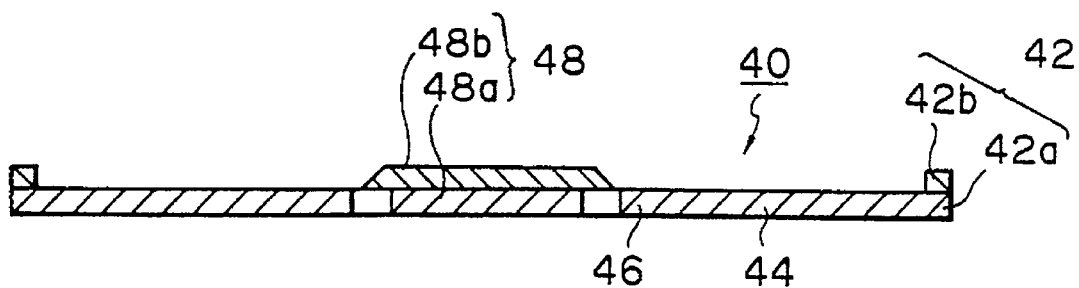
FIG. 11 is a cross-sectional view of an embodiment of a lead frame of the present invention.
Figure 12:
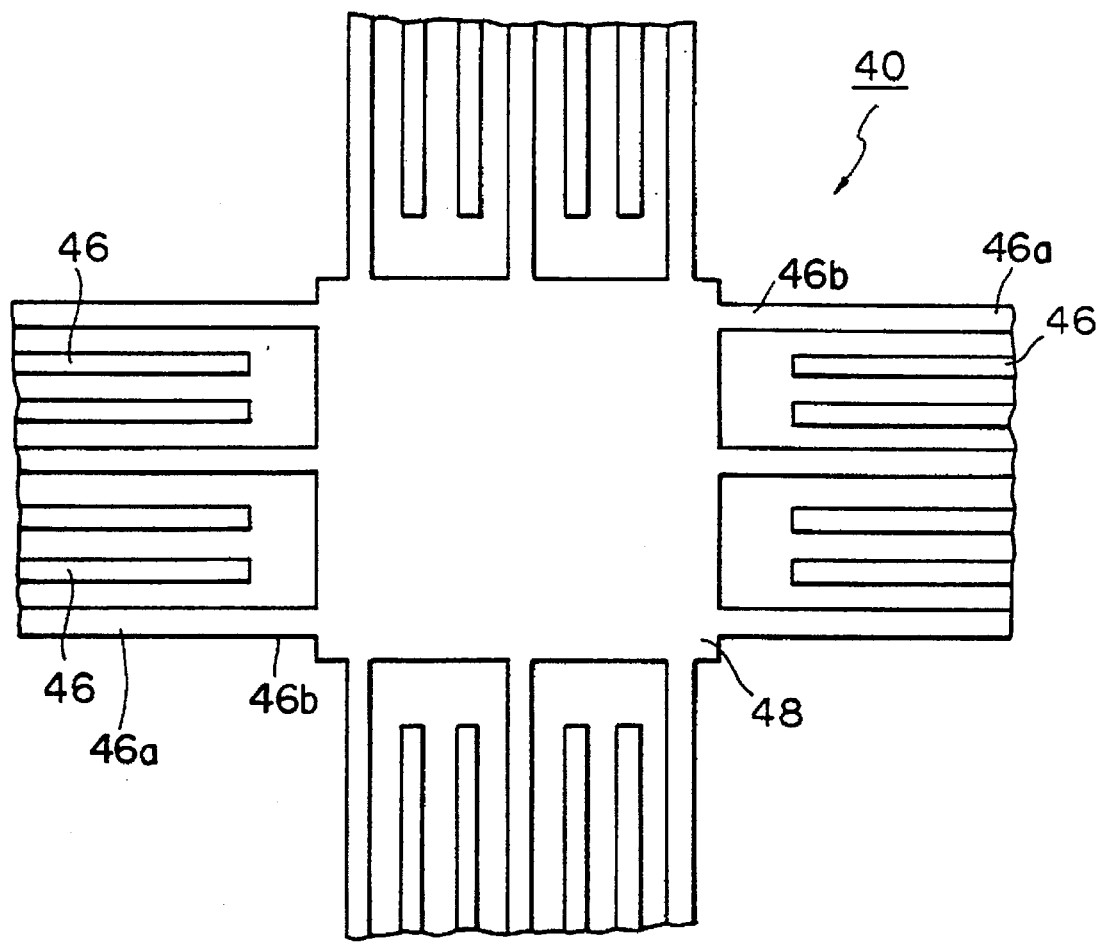
FIG. 12 is a plan view of the embodiment of FIG. 11.

FIG. 11 is a sectional view showing an embodiment of the lead frame 40 according to the present invention, and FIG. 12 is a partial plan view of the same.

The lead frame 40 is manufactured by means of electro-forming as described later, that is, the lead frame 40 is manufactured by forming a plated layer having a predetermined pattern on a matrix by plating.

Numeral 42 is a rail portion, numeral 44 is an outer lead, numeral 46 is an inner lead, and numeral 48 is a stage portion.

In this connection, as shown in FIG. 12, the stage portion 48 may be connected with an inner lead 46a used as the ground lead among the inner leads 46, through a connecting portion 46b. Alternatively, the stage portion 48 may be connected with a stage support bar, although not illustrated in the drawing.

This embodiment is characterized in that: the rail portion 42 and the stage portion 48 are formed thicker than the inner lead 46 from a multi-layer plating coat.

In the example shown in the drawing, the rail portion 42 is composed of a first layer 42a connected with the outer lead 44 and the inner lead 46, and a second layer 42b formed on the first layer 42a.

In the same manner, the stage portion 48 is composed of a first layer 48a connected with the inner lead 46 through a connecting portion, and a second layer 48b formed on this first layer 48a.

From the viewpoint of mechanical strength, it is preferable that the first layer 42a, outer lead 44, inner lead 46 and first layer 48a are preferably composed of a plating coat made of nickel-cobalt alloy.

In order to improve the thermal radiating properties of the stage portion 48, it is preferable that the second layers 42b and 48b be composed of a plated coat made of copper.

It is preferable that the multi-layer is made of different metals as described above, however, the multi-layer may be made of the same metal. The number of layers is not limited to two. If necessary, the number of layers may be three or more.

The purpose of forming the rail portion 42 to be thick is to increase the mechanical strength of the outer lead 44. On the other hand, the outer lead 44 and the inner lead 46 are formed thin, especially the inner lead 46. Therefore, a fine pattern can be made.

Further, even in a lead frame having no stage, such as a lead frame for an LOC (lead on chip) or a COL (chip on lead) type semiconductor device, the rail portion may be formed thick, or the outer lead may be formed thick.

Figure 13:
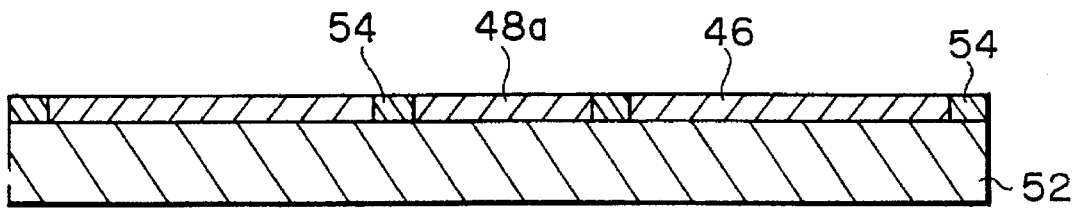
FIGS. 13 and 14 show a manufacturing process of the lead frame shown in FIGS. 11 and 12.
Figure 14:
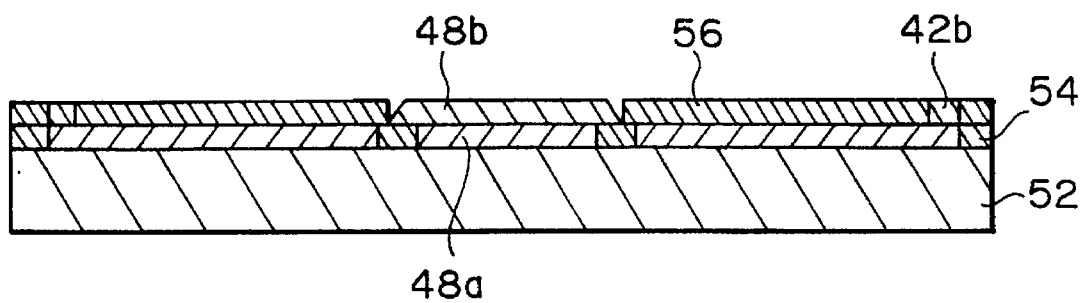

FIGS. 13 and 14 are views showing the manufacturing process of the lead frame 40 shown in FIGS. 11 and 12.

First, a resist is coated on the matrix 52, exposed to light and then developed, so that a predetermined resist pattern 54 is formed. Next, a nickel-cobalt alloy is plated on the matrix 52 by an electro-forming process known in the prior art. In this way, the first layer is formed which includes the first layer 42a of the rail portion 42, the outer lead 44, the inner lead 46, and the first layer 48a of the stage portion 48. At this time, the first layer 48a of the stage portion 48 is connected with the inner lead 46a by the connecting portion 46b.

When necessary, the layer formed in the aforementioned manner is ground by any mechanical means.

Next, as illustrated in FIG. 14, a resist is coated on the pattern of the first layer formed in the aforementioned manner. Then the resist is exposed to light and developed so that a resist pattern 56 is formed for the aforementioned second layers 42b and 48b. Using such a pattern 56, copper is plated so that the second layers 42b and 48b are formed.

Of course, the plating metal of the first and second layers are not limited to the specific materials described above.

In this case, if a pattern for forming the second layer 48b of the stage portion 48 is made a little wider than the first layer 48a, the second layer 48b is formed in such a manner that the second layer 48b is protrudes a little from the outer periphery of the first layer 48a as clearly shown in FIG. 14. Due to the foregoing, in the case of resin sealing, the protruding portion enters into the sealing resin, so that the adhesion between the stage portion 48 and the sealing resin can be improved. Further, the heat conduction area can be extended and the thermal radiating properties can be improved.

Next, the resist is removed with an alkali water solution, and finally the lead frame is peeled off from the matrix 52. In this way, the desired lead frame 40 can be obtained.

When the lead frame 40 is peeled off from the matrix 52, it is preferable that an electrically insulating tape is adhered to the inner lead 46 so that the thin inner lead 46 is not deformed.

Since a surface of the stage portion 48 on the matrix 52 side is a mirror (flat) surface, a semiconductor element may be mounted on the mirror surface side.

Figure 15:
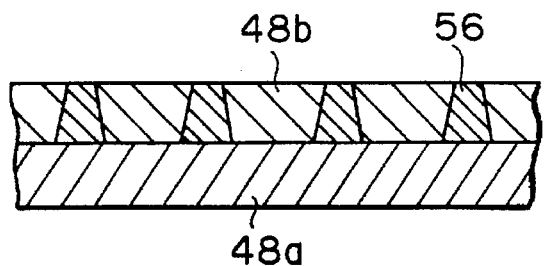
FIG. 15 is a view showing another embodiment of a lead frame of this invention.

FIG. 15 is a view showing another embodiment of this invention.

In this embodiment, when the second layer 48b is formed, a resist layer is formed on the first layer 48a of the stage portion 48, and the resist layer is exposed and developed, so that a resist pattern 56 having a large number of holes can be formed as illustrated in the drawing. It is preferable that the closer to the outer surface the hole is positioned, the larger the diameter of the hole becomes.

In this way, the second layer 48b is formed on the first layer 48a. When the resist pattern 56 is removed, a large number of dimples are formed in the second layer 48b, in which the diameter of the dimples becomes larger inside the layer from which the resist pattern 56 has been removed.

In this way, a large number of dimples are formed in the second layer 48b. Accordingly, when a semiconductor element is mounted on the stage portion 48 and sealed by resin together with the stage portion 48, the sealing resin enters the dimples, so that the stage portion 48 can be closely contacted with the resin.

Although not illustrated in the drawings, even when the second layer 48b of the stage portion 48 is made of the same metal as that of the first layer 48a, or the crystal structure is different and the coated surface is made rough, the sealing properties can be improved with respect to the sealing resin.

Figure 16:
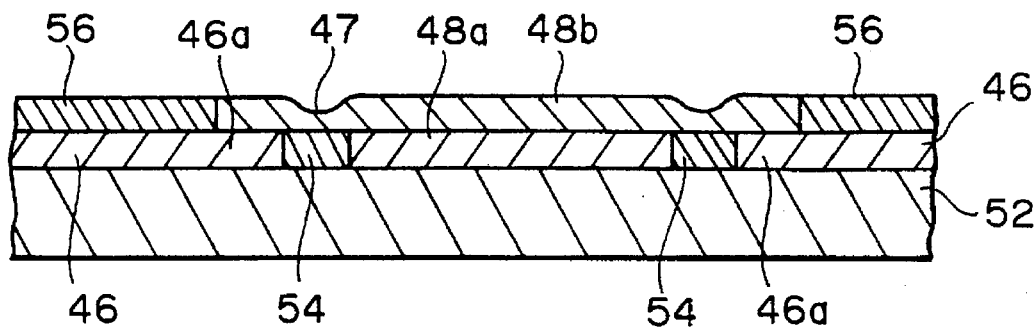
FIG. 16 is a view showing another embodiment of a lead frame of the present invention.

FIG. 16 is a view showing another embodiment of this invention.

In this embodiment, when the first layer is formed, the tip end of the inner lead 46 (used for ground) and the first layer 48a of the stage portion 48 are not connected by the connecting section 46b, but the first layer 48a is completely separate from the inner lead 46.

Next, the resist pattern 56 is formed in a portion except for the first layer 48a of the stage portion 48 and a tip end of the inner lead 46a, and plating is conducted to form the second layer.

Then a plated coat is formed on the tip end of the inner lead 46a, and the first layer 48a of the stage portion 48. As this plated coat grows, it covers the resist 54 between the tip end of the inner lead 46a and the first layer 48a. As a result, the tip end of the inner lead 46a and the first layer 48a are connected by the connecting portion 47, the configuration of which is formed in such a manner that the center is thin as illustrated in the drawing.

In this way, the lead frame 40 can be obtained, in which the tip end of the inner lead 46a and the second layer 48b of the stage portion 48 are connected by the thin connecting portion 47.

According to the lead frame 40 of this embodiment, the stage portion 48 is connected with the inner lead 46 through the thin connecting portion 47. Therefore, the deformation of the inner lead 46a can be prevented in a depressing process in which the stage portion 48 is depressed with respect to the surface of inner lead 46. Although not shown in the drawings, of course, the stage support bar and the stage portion 48 may be connected by a connecting portion in the same manner.

Figure 17:
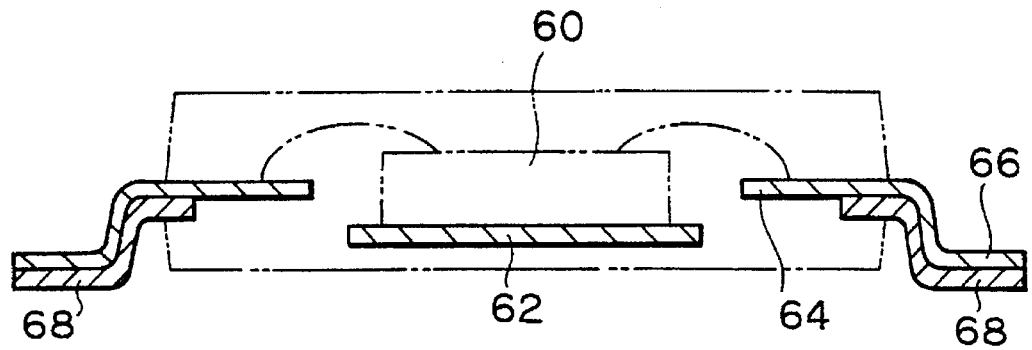
FIG. 17 is a schematic illustration of a lead frame of this invention.

FIG. 17 is a schematic illustration showing another embodiment of the lead frame according to the present invention. In FIG. 17, a semiconductor chip 60 is mounted on the lead frame.

In this embodiment, the entire lead frame is manufactured by means of electro-forming. The main body of the lead frame including a die pad 62, inner lead 64, outer lead 66 and the like is made of copper or copper alloy, and a reinforcing layer 68 is coated on the outer lead portion 66.

The main body of the lead frame is made of copper material as described above for the purpose of providing excellent thermal radiating properties and electric characteristics to the lead frame. The reinforcing layer 68 is provided in the outer lead portion 66 for the purpose of obtaining a predetermined mechanical strength.

With respect to the inner lead portion 64, it is required to form a fine pattern, but mechanical strength is not so important. On the other hand, with respect to the outer lead portion 66, it is required to provide a predetermined mechanical strength in order to conduct lead forming.

Figure 18:
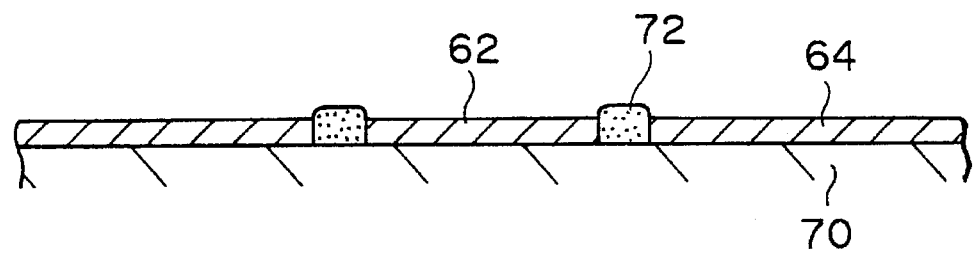
FIGS. 18(a) and 18(b) show a method for manufacturing the lead frame shown in FIG. 17.
Figure 18:
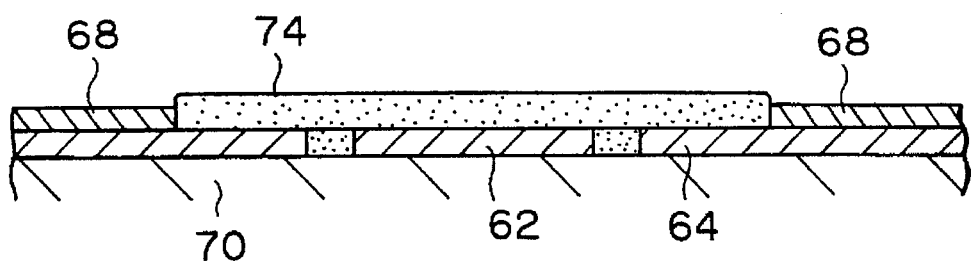

FIGS. 18(a) and 18(b) show views for illustrating a method for manufacturing the aforementioned lead frame by means of electro-forming.

A main body of the lead frame is obtained when electro-forming is conducted on the matrix 70 with a predetermined pattern, and after that, the formed lead frame is peeled off from the matrix 70. Therefore, first, a resist pattern 72 is formed on the matrix 70 in accordance with the predetermined patterns of the die pad 62, inner lead 64, outer lead 66 and the like. The resist pattern 72 can be formed when a resist is coated on the matrix 70 and exposed to light and developed using a predetermined pattern.

Next, a metallic layer is formed on the matrix 70 from copper material, wherein the matrix 70 is used for an electrode. Due to the foregoing, the die pad 62, inner lead 64 and the like are made of copper material, as shown in FIG. 18(a).

According to the method for forming a lead frame by means of electro-forming, the inner lead 64 and others are formed in accordance with the resist pattern 72 formed on the matrix 60. Therefore, the accuracy of the lead frame pattern is determined by the accuracy of formation of the resist pattern 72. Accordingly, even a lead frame having a fine pitch can be manufactured very accurately.

The electro-forming method is advantageous in that the accuracy is not affected by the thickness of the lead frame member.

After the die pad 62, inner lead 64 and others have been formed by electro-forming in the manner described above, the die pad 62 and the inner lead 64 are covered with the resist 74 as shown in FIG. 18(b), and the outer lead 66 portion is further subjected to electro-forming.

In the case where the outer lead 66 portion is subjected to electro-forming, a resist pattern may be formed again in the outer lead portion when the coat of the resist 74 is formed. Alternatively, a resist pattern may be used which was provided when the metallic layer was previously formed from copper material.

In this case, the outer lead 66 portion is subjected to electro-forming using a material selected from nickel, iron and the like, the mechanical strength of which is high. In this way, the reinforcing layer 68 can be formed on the outer lead 66 portion.

After the reinforcing layer 68 has been provided on the outer lead 66 in the manner described above, the unnecessary resist 74 is removed and the lead frame is peeled off from the matrix 70. In this way, a lead frame product can be obtained.

In the obtained lead frame product, the die pad 62, inner lead 64 and outer lead 66 are formed from copper material. Further, the outer lead 66 portion is covered with the reinforcing layer 68 made of nickel or iron. Accordingly, a lead frame product can be obtained, in which the die pad 62 portion and the outer lead 66 portion are provided with excellent radiating properties and further the electric characteristics of the lead frame product are excellent. In this lead frame product, the outer lead 66 is provided with a predetermined mechanical strength, and lead forming can be appropriately carried out, and further the deformation of the lead can be prevented. In this way, a highly reliable product can be obtained.

Figure 19:
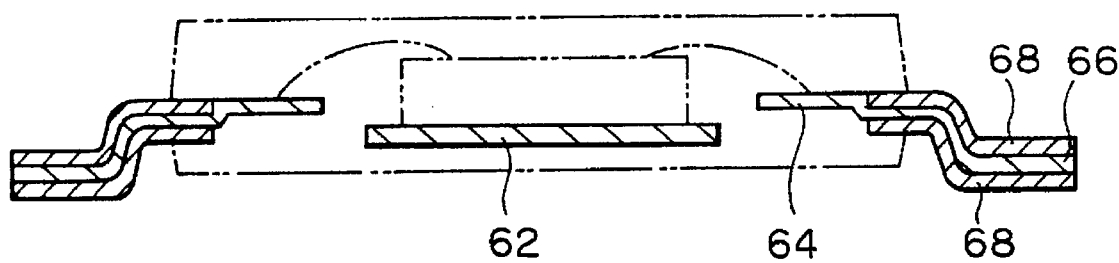
FIG. 19 shows another embodiment of a lead frame of the present invention.

The product of the above embodiment is composed of two layers in such a manner that only one side of the outer lead 66 is coated with the reinforcing layer 68. However, as illustrated in FIG. 19, it is possible to employ a three layer structure in which the reinforcing layers 68 are provided on both sides of the outer lead 66. When the three layer structure is adopted in the manner described above, the reinforcing effect of the outer lead 66 is further improved.

In the case where the three layer structure is adopted, the reinforcing layer 68 of the outer lead 66 portion is formed on the matrix 70 by means of electro-forming before the main body portion of the lead frame is formed from copper material, and then the main portion of the lead frame is formed, and further the reinforcing layer 68 is formed. In the case of the three layer structure, a metallic layer on the inner lead portion is formed on the same surface as the reinforcing layer 68 formed in the beginning.

As described above, the order to form the metallic layer on the matrix 70 is not specifically limited. In the embodiment shown in FIG. 17, the main body portion of the lead frame may be formed from copper material after the reinforcing layer 68 has been subjected to pattern formation.

Also, the reinforcing layer 68 may be made of the same metal as that of the metallic layer of the main body of the lead frame.

In the embodiments shown in FIGS. 17 and 19, the die pad 62 portion is composed of only one layer made of copper material; however, the die pad 62 portion may be composed of two layers, by the reinforcing material, in the same manner as that of the outer lead 66.

In the above embodiments, after the lead frame has been formed on the matrix 70 from copper material and reinforcing material, the lead frame is peeled off from the matrix 70 so as to obtain the product. However, the following method may be employed: For example, an aluminum film which can be easily removed by etching is previously formed on the matrix 70. A lead frame is formed on this aluminum film by means of electro-forming in the same manner as that of the above embodiment. After that, the lead frame is peeled off from the matrix 70 with respect to the aluminum film portion, and then the aluminum film is removed by means of etching. In this way, the product can be obtained.

In the case where the reinforcing layer 68 is provided on the outer lead 66, as illustrated in FIGS. 17 and 19, it is designed so that a portion of the outer lead 66 reinforced by the reinforcing layer 68 can partially enter the sealing resin. When an end of the reinforcing layer 68 partially enters the sealing resin so as to seal the resin, mechanical strength of the lead can be positively maintained in the boundary portion between the sealing resin and the outer lead. Therefore, the formation of the lead can be positively carried out, and the deformation of the outer lead 66 can be effectively prevented.

With reference to preferred embodiments, the present invention is variously explained above. However, it should be noted that the present invention is not limited to the specific embodiments, and it is a matter of course that such variations, modifications and eliminations of parts may be made therein within the scope of the appended claims without departing from the spirit of the invention.

We claim:

1. A method for manufacturing a lead frame on a major surface of a matrix, comprising the steps of:

forming a resist pattern on said major surface of said matrix, the resist pattern having therein a connection cavity connecting tip ends of a plurality of inner lead cavities, the connection cavity and the inner lead cavities having a trapezoidal cross-section in a plane perpendicular to the major surface of the matrix and in which the edge of the trapezoid adjacent the major surface of the matrix is greater in dimension than the edge of the trapezoid on the side thereof remote from the major surface of the matrix;

forming an electro-deposition pattern in said connection cavity and said plurality of inner lead cavities such that tip ends of inner leads, formed in the inner lead cavities, are connected by a connecting piece formed in the connection cavity; and separating said electro-deposition pattern from said cavities of said resist and from said matrix while the tip ends of said inner leads are connected by said connecting piece.

2. A method for manufacturing a lead frame according to claim 1, said method further comprising the steps of:

conducting a plating process, after the separation of said electro-deposition pattern from the matrix but while maintaining the tip ends of said inner leads connected by said connecting piece; and removing said connecting piece from said inner leads of said electro-deposition pattern.

3. A method for manufacturing a lead frame according to claim 1, further comprising the step of providing said resist pattern with a reduced height resist portion, relatively to the height of the remainder of the resist pattern, in respective locations between the tip ends of said inner lead cavities and said connection cavity.

4. A method for manufacturing a lead frame as recited in claim 1, further comprising the steps of:

prior to the separating step, forming a plated coat on said electro-deposition pattern after said electro-deposition pattern has been formed on said matrix; and then separating said electro-deposition pattern, with said plated coat formed thereon, from said matrix.

5. A method for manufacturing a lead frame on a major surface of a matrix, comprising the steps of:

forming a resist pattern on said major surface of said matrix, said resist pattern having a cavity therein corresponding to a pattern of the lead frame, the cavity having a trapezoidal cross-section in a plane perpendicular to the major surface of the matrix and in which the edge of the trapezoid adjacent the major surface of the matrix is greater in dimension that the edge of the trapezoid on the side thereof remote from the major surface of the matrix;

forming an electro-deposition pattern in said cavity of the resist pattern;

removing said resist pattern after said electro-deposition pattern has been formed;

fixing a portion of said electro-deposition pattern, corresponding to inner leads and in which said electro-deposition pattern is dense, with a fixing member; and separating said electro-deposition pattern from said matrix while maintaining said fixing member fixed to said portion of said electro-deposition pattern.

6. A method for manufacturing a lead frame according to claim 5, wherein said fixing member comprises an adhesive tape.

7. A method for manufacturing a lead frame on a major surface of a matrix, comprising the steps of:

forming a resist pattern on said major surface of said matrix, said resist pattern having a cavity therein corresponding to a pattern of the lead frame, the cavity having a trapezoidal cross-section in a plane perpendicular to the major surface of the matrix and in which the edge of the trapezoid adjacent the major surface of the matrix is greater in dimension that the edge of the trapezoid on the side thereof remote from the major surface of the matrix;

forming an electro-deposition pattern in said cavity of the resist pattern;

removing said resist pattern after said electro-deposition pattern has been formed;

providing a dumb bar in base portions of outer leads of said electro-deposition pattern for preventing leakage of resin in the process of molding and also for fixing said outer leads; and separating said electro-deposition pattern from said matrix while said outer leads remain fixed by said dumb bar.

* * * * *

UNITED STATES PATENT AND TRADEMARK OFFICE
CERTIFICATE OF CORRECTION

PATENT NO.   : 5,643,433
DATED        : July 1, 1997
INVENTOR(S)  : Fukase et al.

It is certified that error appears in the above-identified patent and that said Letters Patent is hereby corrected as shown below:

Column 4,
Line 56, change "this" to -- the present --.

Column 5,
Line 5, change "FIG." to -- FIGS. --.

Column 10,
Line 21, after "stage" insert -- portion --;
Line 50, after "48b" delete -- is --.

Column 14,
Line 51, change "that" to -- than --.

Column 15,
Line 9, change "that" to -- than --.

Signed and Sealed this

Fifteenth Day of April, 2003

JAMES E. ROGAN
*Director of the United States Patent and Trademark Office*